United States Patent [19]

Gibbs et al.

[11] Patent Number: 5,383,204
[45] Date of Patent: Jan. 17, 1995

[54] PARALLEL ENCODING APPARATUS AND METHOD IMPLEMENTING CYCLIC REDUNDANCY CHECK AND REED-SOLOMON CODES

[75] Inventors: Vickie L. Gibbs; Rom-Shen Kao, both of Durham, N.C.

[73] Assignee: Mitsubishi Semiconductor America, Inc., Durham, N.C.

[21] Appl. No.: 82,870

[22] Filed: Jun. 29, 1993

[51] Int. Cl.⁶ ............................................. G06F 11/10
[52] U.S. Cl. .................................. 371/37.7; 371/37.5
[58] Field of Search ...................... 371/37.5, 37.7, 37.8

[56] References Cited

U.S. PATENT DOCUMENTS

| | | | |
|---|---|---|---|
| Re. 33,462 | 11/1990 | Suzuki et al. | 371/37.5 |
| 4,633,471 | 12/1986 | Perera et al. | 371/37.7 |
| 4,680,764 | 7/1987 | Suzuki et al. | 371/37.7 |
| 4,951,284 | 8/1990 | Abdel-Ghaffar et al. | 371/38.1 |

*Primary Examiner*—Paul Gordon
*Attorney, Agent, or Firm*—Lowe, Price, LeBlanc & Becker

[57] ABSTRACT

In an error correction system, which incorporates Cyclic Redundancy Check (CRC) and a Reed-Solomon (RS) code, original data are encoded simultaneously by CRC and RS encoders. The CRC encoder processes the words 0-9 of the original data to form CRC check bytes, which become the last bytes in words 6, 7, 8 and 9. The RS encoder processes 104-byte words 0-9 of original data to form 16 redundant RS bytes per word. The words 0-5 are simultaneously supplied from a codeword memory to CRC and RS encoders. The redundant RS bytes generated by the RS encoder are sent back to the codeword memory, while the CRC encoder saves the CRC check bytes in local registers. For words 6-9 the RS encoder processes the bytes of original data and stops processing before the CRC bytes. It then temporarily saves the generated data in the codeword memory and waits for the CRC encoder to finish encoding. Once the CRC encoder completes, the CRC bytes corresponding to the words 6-9 are processed by the RS. encoder to finish each set of the redundant RS bytes.

14 Claims, 8 Drawing Sheets

PARALLEL ENCODING APPARATUS AND METHOD IMPLEMENTING CYCLIC REDUNDANCY CHECK AND REED-SOLOMON CODES

TECHNICAL FIELD

This invention relates generally to error control, and more particularly, to parallel encoding method implementing Cyclic Redundancy Check (CRC) and Reed-Solomon (RS) codes to detect and correct errors that occur during data storage.

BACKGROUND ART

Since a storage medium is subject to various types of noise, distortion and interference, various errors can occur at the output of the storage medium. The massive amount of digital data stored in an optical disk storage increases the probability of the errors. To correct the errors, error control coding is used to transform an original information sequence into code words, which contain original data bytes and redundant bytes appended to the end. The redundant bytes of the code words written on the storage medium are used to recover the original data information which has been corrupted.

In optical disk applications, the code words are formed based on an International Standard Organization (ISO) Standard that requires Cyclic Redundancy Check (CRC) encoding and incorporates a Reed-Solomon (RS) code over some Galois fields.

The Galois field is a finite field, the elements of which may be represented as polynomials with a particular primitive element as variables. The RS code represents a block sequence of symbols over a Galois field $GF(2^m)$ of $2^m$ binary symbols, where m is the number of bits per symbol. Constructing the Galois field $GF(2^m)$ requires a generator polynomial p(x) of degree m and a primitive element $\beta$, which is a root of p(x). The powers of $\beta$ generate all nonzero elements of $GF(2^m)$.

The RS (n,k) code is a cyclic symbol error-correcting code where k symbols of an original data are encoded. The result, which is an (n-k)-symbol redundancy block, is appended to the data.

For error correction circuitry capable of correcting a maximum of 8 errors for every 120-byte code word (up to 10 words) used in an optical disk storage, a shortened RS (120,104) code over the Galois field $GF(2^8)$ is required. In order to generate $GF(2^8)$, a generator polynomial p(x) of degree 8 (e.g. $p(x)=1+x^2+x^3+x^5+x^8$) and a primitive element $\beta^j$ are required. The primitive element $\beta^j$ can be used to generate another field by the same polynomial. The j represents a number coprime to $2^m-1$ for $GF(2^m)$, i.e. a number which is not divisible by $2^m-1$ or any of its factors. For $GF(2^8)$, there are 128 different primitive elements $\beta^j$, which can be used to generate various fields from each particular generator polynomial. This field consists of 256 vectors which represent every number between and including 0 to 255. The nonzero vectors are referenced using a specific element $\alpha^i$, where i=0, 1, ..., 254.

The cyclic redundancy check (CRC) is a cumulative parity check, which can be performed by a linear feedback shift register (LFSR) structure. In accordance with the ISO requirements, the LFSR should process each of the ten 104-byte words of the original data to generate in 104 steps four CRC data bytes appended as the last bytes to last four words.

To correct up to 8 errors per word for up to 10 words, an RS encoder uses a similar LFSR structure as in the CRC, which processes each of 104-byte words of the original data to form 16 redundant bytes in 104 steps. These redundant bytes are appended to each original word to make a 120-byte RS code word to be written into a codeword memory.

Reference is now made to FIG. 1 of the drawings showing interaction between RS and CRC encoders during encoding procedure. Words 0-9 of the original data stored in a codeword memory 22 are supplied to a CRC encoder 24, which processes the 104-byte words to generate four CRC bytes. The CRC bytes are sent back to the codeword memory 22 to replace the last byte in each of the last four words stored in the memory. The content of the codeword memory 22 is shown in FIG. 2, wherein the original data are represented as a 10 by 104 matrix. The 10 columns of the matrix correspond to the words 0 to 9 of the original data, and 104 rows of the matrix correspond to the bytes 0 to 103 of each word. The four CRC bytes generated by the CRC encoder 24 are represented in the matrix as C1, C2, C3 and C4 in bytes 103 of words 6, 7, 8 and 9.

After the CRC encoder 24 has saved the CRC bytes in the codeword memory 22, an RS encoder 26 reads the words 0-9 having the CRC bytes in the words 6-9 from the codeword memory 22 to generate 16 RS redundant bytes for each of the 10 words. The RS redundant bytes are sent back to the codeword memory 22 to be appended to each of the 10 words. In the memory matrix in FIG. 2, the RS redundant bytes are represented as 16 additional rows corresponding to bytes 104 to 119 of words 0 to 9.

Thus, the RS and CRC encoders sequentially process the original data during the encoding procedure. The sequential method is simple but takes a long time. To process 10 words, each of which includes 104 bytes, and to extract 4 CRC bytes per word, the CRC encoder requires 1080 total steps. The RS encoder processes the same number of 104-byte words, but outputs 16 RS bytes per word. Accordingly, the RS encoding requires 1200 steps. Thus, the sequential method of encoding requires 2280 steps. Reduction of the encoding time would allow the error correction circuit to increase the processing speed.

In view of the above, it would be desirable to provide a method of data encoding, wherein RS encoding and CRC encoding are provided in parallel to reduce the total time of encoding.

DISCLOSURE OF THE INVENTION

Accordingly, one advantage of the invention is in reducing time of encoding procedure incorporating Cyclic Redundancy Check (CRC) and Reed-Solomon (RS) codes.

The above and other advantages of the invention are achieved, at least in part, by providing a method of encoding incoming data elements, wherein CRC encoding and RS encoding procedures are performed, at least in part, in parallel. For a RS (n,k) code, the incoming data elements to be encoded are interleaved into q codewords. Each codeword contains k original data bytes. To perform the CRC, q codewords are used to produce the h check elements. The RS encoding process uses each codeword to produce (n-k) redundant bytes, which are appended to the end of each corresponding codeword. The procedures of CRC and RS encoding of the codewords are performed simultaneously. However, the last h codewords, which contain the CRC check bytes, must wait until the correct CRC bytes have been calculated before the RS redundant bytes can be calculated for those last h codewords.

In accordance with a first preferred embodiment of the invention the step of processing the last h of the q codewords includes CRC encoding to incorporate the h check elements. While the CRC is computing the last h words, the RS encoder is processing, but computing invalid data. This RS data is invalid because the CRC check bytes need to be included in the memory and processed by the RS circuit in order to produce correct redundancy bytes. After the check elements have been saved to the codeword memory, the last h codewords having h checking elements are subject to RS encoding, and valid RS redundancy bytes are saved to the codeword memory, erasing the invalid data which had been stored there.

In accordance with a second preferred embodiment of the invention the last h codewords are subject to simultaneous RS and CRC encoding procedure, which includes the processes of:

selectively RS encoding the incoming elements of the last h codewords, and

CRC encoding the incoming elements of the last h codewords to replace h of the incoming elements with h checking elements.

The process of CRC encoding the last h codewords is performed simultaneously with the step of selectively RS encoding. Each of the h check elements replaces the last incoming element of each of the last h codewords. Thereafter, the check elements are subject to RS encoding.

In accordance with one aspect of the invention, the process of selectively RS encoding more particularly comprises the process of RS encoding all of the incoming elements of the last h codewords except the incoming elements to be replaced with the check elements, and saving this information to the codeword memory.

In accordance with another aspect, the process of RS encoding the check elements more particularly comprises the processes of:

receiving the check elements formed in the (k-1) the bytes of the last h codewords, and thereafter using these check elements formed in the last h codewords to finish RS encoding the remainder of the last h codewords.

Still other advantages of the present invention will become readily apparent to those skilled in this art from the following detailed description, wherein only the preferred embodiments of the invention are shown and described, simply by way of illustration of the best modes contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BEST MODE FOR CARRYING OUT THE INVENTION

The best mode for practicing the invention is based on the realization that for error correction circuitry of an optical disk storage capable of correcting a maximum of 8 errors per word for up to ten 120-byte code words, a shortened Reed-Solomon RS (120, 104) code over the Galois field $GF(2^8)$ is used. Therefore, in accordance with the best mode the RS encoder processes 104-byte words 0-9 of original data to generate 16 redundancy bytes per word to be appended to each of the words to form the 120-byte code words. In accordance with the International Organization for Standards (ISO) requirements, the CRC encoder processes words 0-9 of the original data to form four CRC bytes, which become the last bytes in words 6, 7, 8 and 9.

Figure 1:
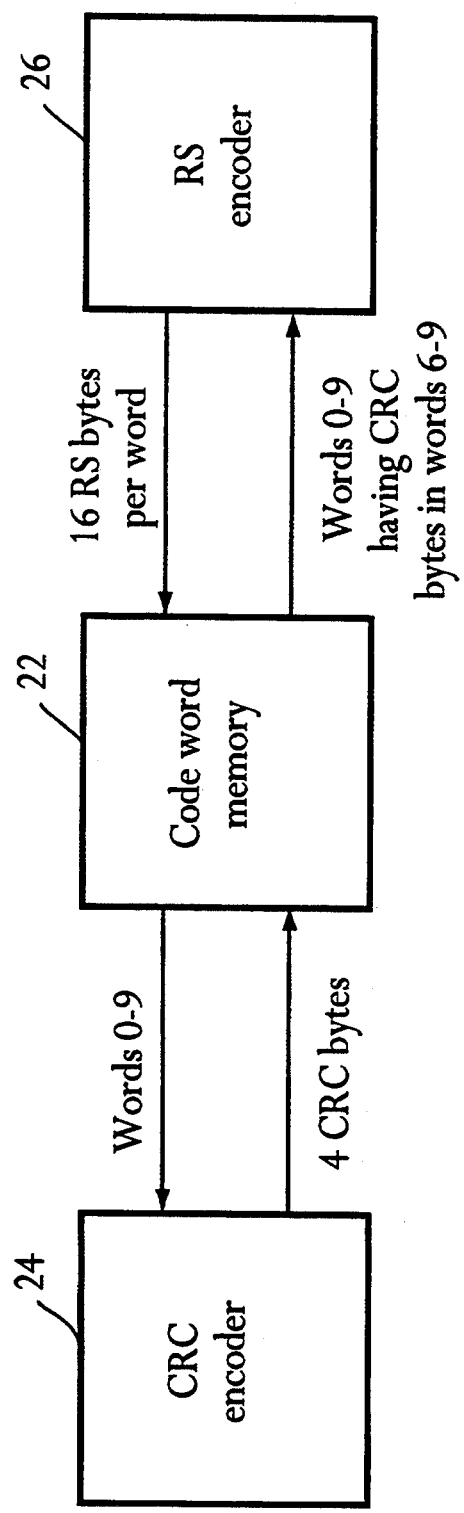
FIG. 1 is a block-diagram illustrating a sequential method of encoding data words in a system for correcting errors.
Figure 2:
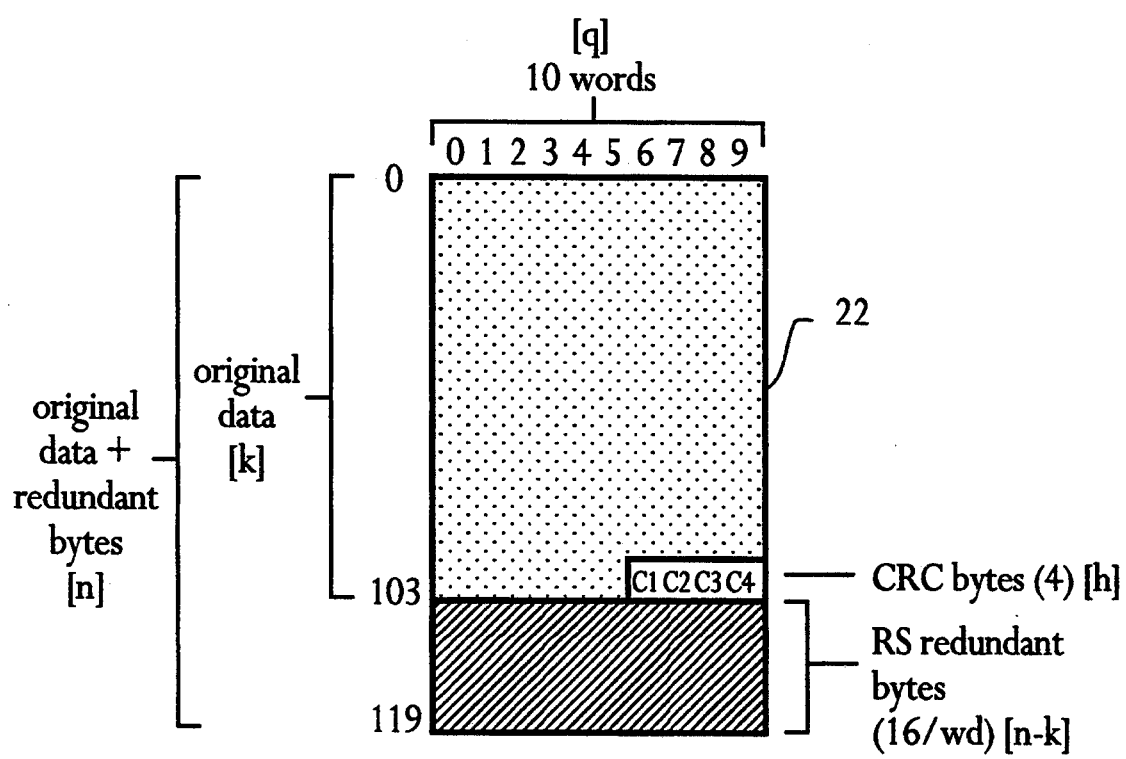
FIG. 2 is a diagram showing contents of the codeword memory.
Figure 3:
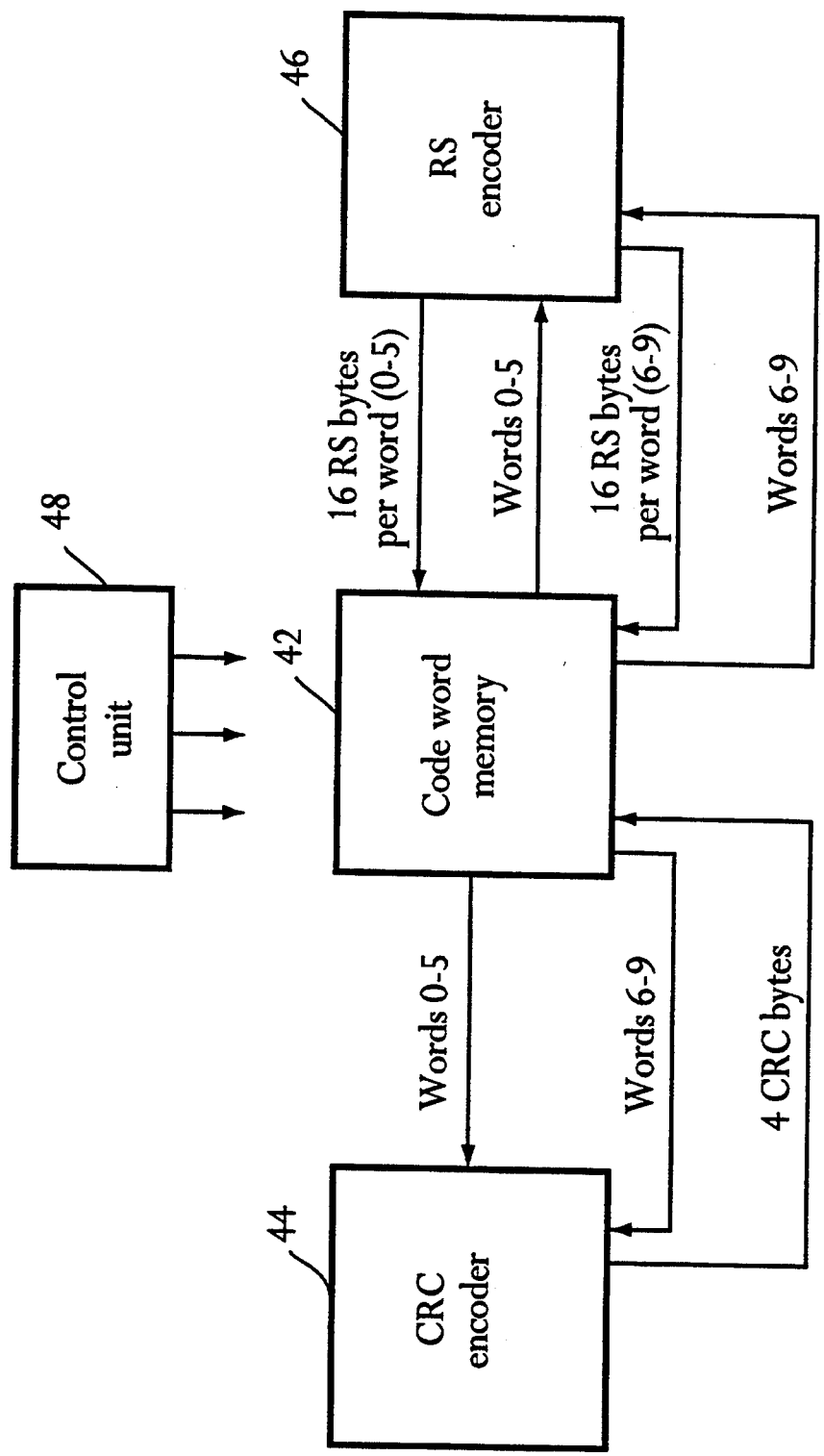
FIG. 3 is a block-diagram illustrating a semiparallel method of encoding in accordance with the first embodiment of the present invention.

Reference is now made to FIG. 3 of the drawings illustrating a semi-parallel method of CRC and RS encoding in accordance with a first embodiment of the present invention. Words 0-5 of the original data stored in a codeword memory 42 are simultaneously applied to a CRC encoder 44 and an RS encoder 46 under control of a control unit 48, which supplies the encoders and the memory with control and clock signals. The contents of the codeword memory 42 are similar to the contents of the codeword memory 22 shown in FIG. 2.

Figure 4:
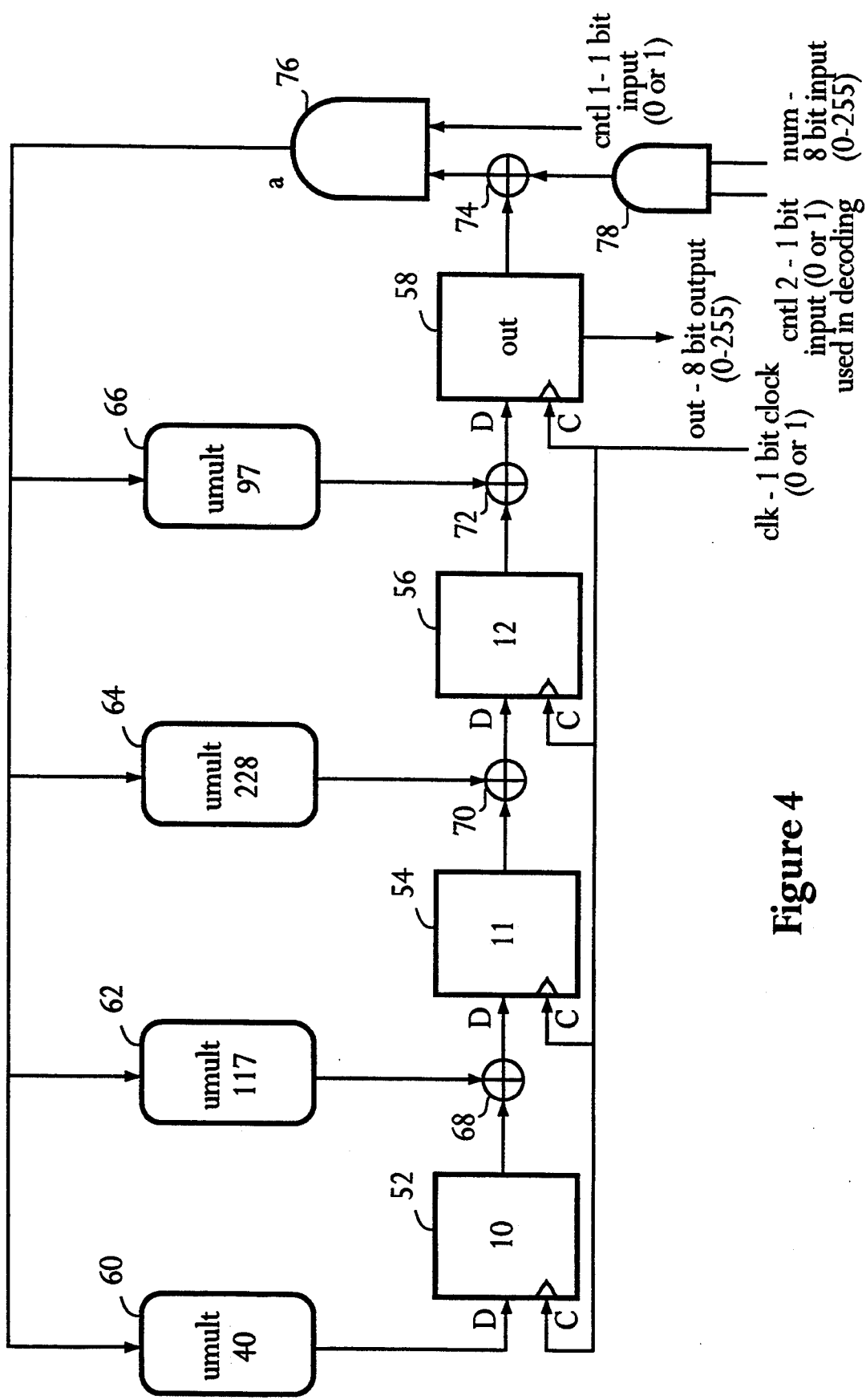
FIG. 4 is a diagram showing a Cyclic Redundancy Code encoder of a system for correcting errors according to the present invention.

As shown in FIG. 4, the CRC encoder 44 comprises a set of flip-flops 52–58 operating as a linear feedback shift register (LFSR). 8-bit data inputs D of the flip-flops are connected to 8-bit unary multipliers 60–66 for unary multiplication by the Galois field elements $\alpha^{40}$, $\alpha^{117}$, $\alpha^{228}$ and $\alpha^{97}$, respectively. The unary multipliers 62–66 are respectively connected to the data inputs of the flip-flops 54–58 through Exclusive-OR (XOR) gates 68–72. The unary multiplier 60 is directly connected to the data input of the flip-flop 52. An XOR gate 74 creates a feedback path for connecting the output of the shift registers to the corresponding data inputs. The output of the XOR gate 74 is connected to an input of an AND gate 76, a second input of which is connected to a 1-bit control input supplied with control signals generated by the control unit 48. The input data are entered into the CRC encoder through an 8-bit input of an AND gate 78, a second input of which is used in decoding procedure, because usually the same CRC module is used for CRC decoding as well as for CRC encoding. Clock inputs C of the flip-flops 52–58 are supplied with 1-bit clock signals generated by a clock circuit (not shown) of the control unit 48.

Figure 5:
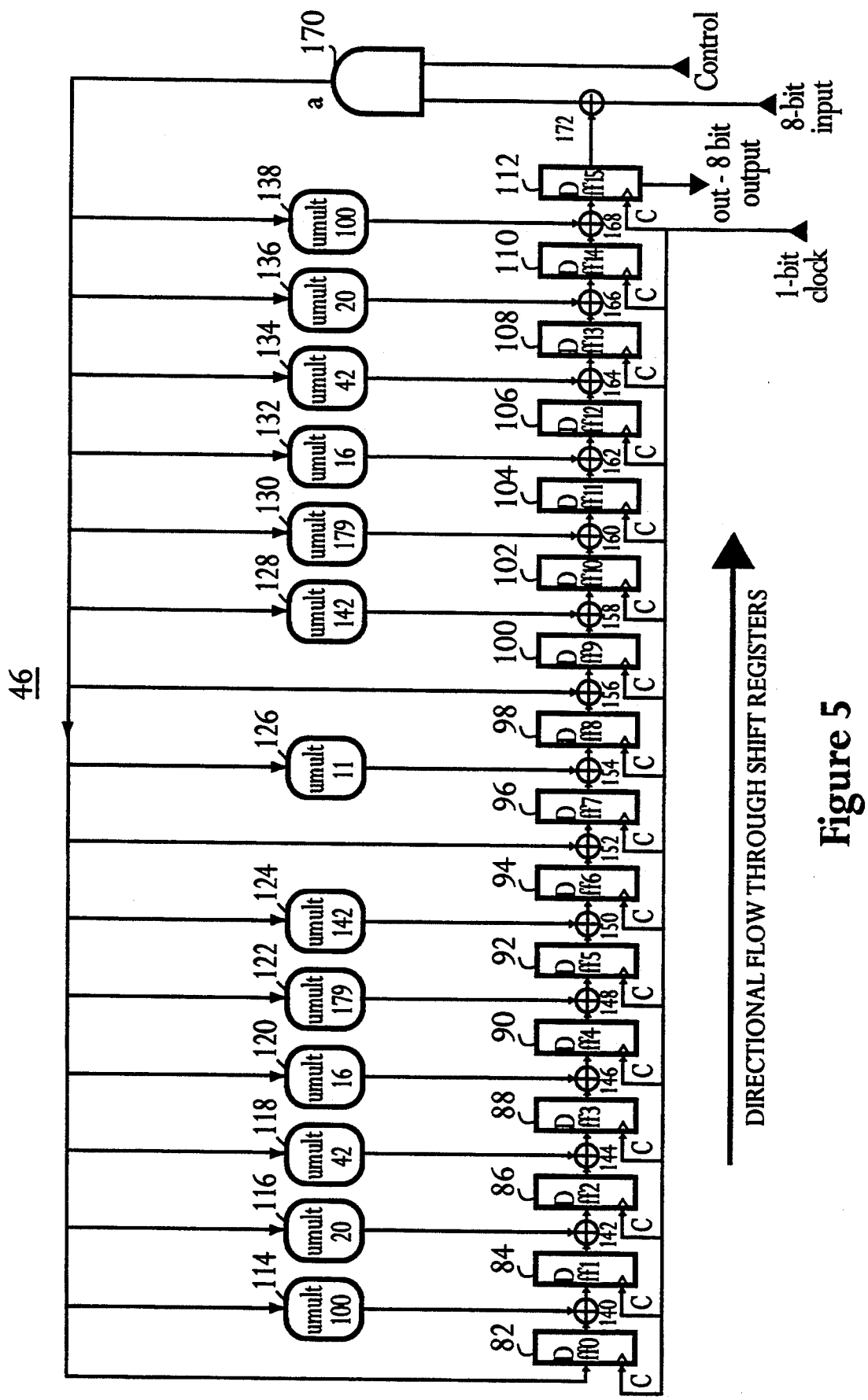
FIG. 5 is a diagram showing a Reed-Solomon encoder of the system for correcting errors according to the present invention.

As shown in FIG. 5, the RS encoder 46 comprises a set of sixteen flip-flops 82-112 representing a LFSR. Each of the flip-flops 82-112 has an 8-bit data input D, a 1-bit clock input C and an 8-bit output. Feedback loops of the LFSR comprise unary multipliers 114-138 for respectively multiplying a feedback signal by the Galois field elements $\alpha^{180}$, $\alpha^{20}$, $\alpha^{42}$, $\alpha^{16}$, $\alpha^{179}$, $\alpha^{142}$, $\alpha^{11}$, $\alpha^{142}$, $\alpha^{179}$, $\alpha^{16}$, $\alpha^{42}$, $\alpha^{20}$, and $\alpha^{180}$. Unary multipliers 114-124 are respectively connected to the data inputs of the flip-flops 84-94 through XOR gates 140-150. Unary multiplier 126 is connected through XOR gate 154 to the data input of the flip-flop 98. The unary multipliers 12-138 are respectively connected to the data inputs of the flip-flops 102-112 through XOR gates 158-168. The data inputs of the flip-flops 82, 96 and 100 are supplied with a feedback signal. Second inputs of the XOR gates 140-168 receive the outputs of the corresponding flip-flops. The feedback signal is generated by an AND gate 170, the first input of which is connected through an XOR gate 172 to the output of the LFSR. 8-bit input data are supplied to the RS encoder through the second input of the XOR gate 172. The second input of the AND gate 170 is supplied with 1-bit control signals generated by the control unit 48. Clock inputs C of the flip-flops 82-112 are supplied with 1-bit clock signals generated by the clock circuit (not shown) of the control unit 48.

Accordingly, the 8-bit bytes 0-103 of each of the words 0-5 are supplied from the codeword memory 42 to the 8-bit input of the AND gate 78 (of the CRC encoder 44) and to the 8-bit input of the XOR gate 172 (of the RS encoder 46). The clock signals counted by a counter of the control unit 48 are simultaneously applied to the clock inputs of both the encoders to shift corresponding bytes through the LFSRs. To process 104 bytes of each word each encoder requires 104 steps performed under control of the clock signals (counts 0-103 of the counter). Each step corresponds to a count of the counter. As both the encoders process the words 0-5 simultaneously, the number of steps required for the RS and CRC encoders to process words 0-5 is equal to $104 \times 6 = 624$. After processing each of words 0-5, the RS encoder 46 outputs 16 RS redundant bytes into the codeword memory 42. It requires 16 steps per word more. The generated CRC redundancy bytes are accumulated in registers 52-58 of the CRC encoder 44. Accordingly, the total number of steps required to process words 0-5 and to extract 16 RS redundant bytes per word is equal to $(104 + 16) \times 6 = 720$.

After encoding words 0-5, bytes 0-103 of words 6-9 are applied from the codeword memory 42 to the AND gate 78 of the CRC encoder 44, and simultaneously to the xor gate 172 of the RS encoder 46. The CRC circuit processes the bytes of each word in 104 steps to generate CRC redundant bytes. During this period, the RS circuit processes the same data. However, the RS encoder will output in alid data to the codeword memory because the CRC check bytes must be included in the input data for the RS redundancy bytes to be valid. After codeword 9 is processed, the generated CRC bytes are sent back to the codeword memory 42 to replace byte 103 of original words 6-9, as shown in FIG. 2. Thus, $(104 + 4) \times 4 = 432$ steps are required to process words 6-9 and extract 4 CRC outputs per word.

After CRC encoding, words 6-9 having bytes 103 replaced by the CRC bytes are supplied from the codeword memory 42 to the RS encoder 46, which requires $(104 + 16) \times 4 = 480$ steps to process bytes 0-103 of words 6-9 and to send generated 16 RS redundancy bytes per word back to the codeword memory 42.

Thus, the semi-parallel method of RS and CRC encoding in accordance with the first embodiment of the present invention includes 720 steps required for both of the CRC and RS encoders 44 and 46 to simultaneously encode words 0-5, 432 steps required for the CRC encoder 44 to encode words 6-9 and 480 steps required for the RS encoder 46 to encode words 6-9. Accordingly, the total number of the steps performed during the semi-parallel RS and CRC encoding is equal to $720 + 432 + 480 = 1632$. For comparison, as indicated above, the prior art sequential method of encoding requires 2280 steps of the same duration.

A second embodiment of the present invention uses the codeword memory 42, CRC encoder 44, RS encoder 46 and control unit 48 shown in FIGS. 3-5 for fully parallel RS and CRC encoding of the original data stored in the codeword memory 42, the contents of which are similar to contents of the codeword memory 22 shown in FIG. 2.

Figure 6:
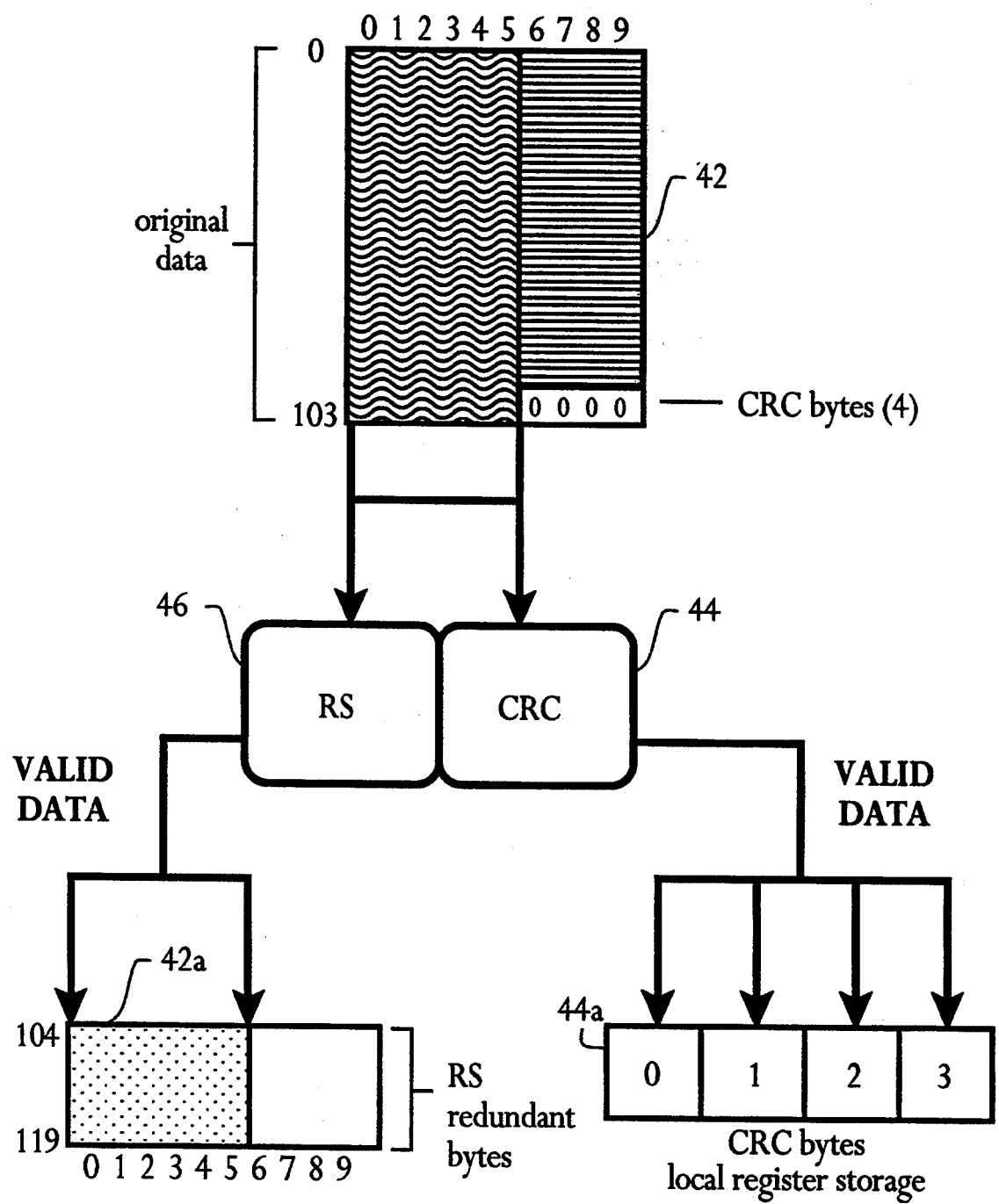
FIG. 6 is a diagram illustrating initial steps of a parallel method of encoding in accordance with a second embodiment of the present invention.

Reference is now made to FIG. 6 of the drawings illustrating the initial steps of the parallel method of encoding in accordance with the second embodiment of the present invention. Similarly to the semi-parallel method, bytes 0-103 of words 0-5 are simultaneously supplied from the codeword memory 42 to the CRC encoder 44 and to the RS encoder 46. The bytes are shifted into the corresponding encoders under control of the clock signals supplied by the clock circuit of the control unit 48 and counted by the counter of the control unit 48. During counts 0-103 of the counter, bytes 0-103 of the corresponding word are processed simultaneously by the CRC and RS encoders. During counts 104-107, the CRC encoder 44 saves the generated CRC values into four registers 0-3 of its local storage 44a. During counts 108-123, the RS redundant bytes formed by the RS encoder 46 are extracted and saved into a section 42a of the codeword memory 42 to form bytes 104-119 of the words 0-5 stored in the codeword memory 42. The counts 0-123 are repeated for all of the words 0-5.

Figure 7:
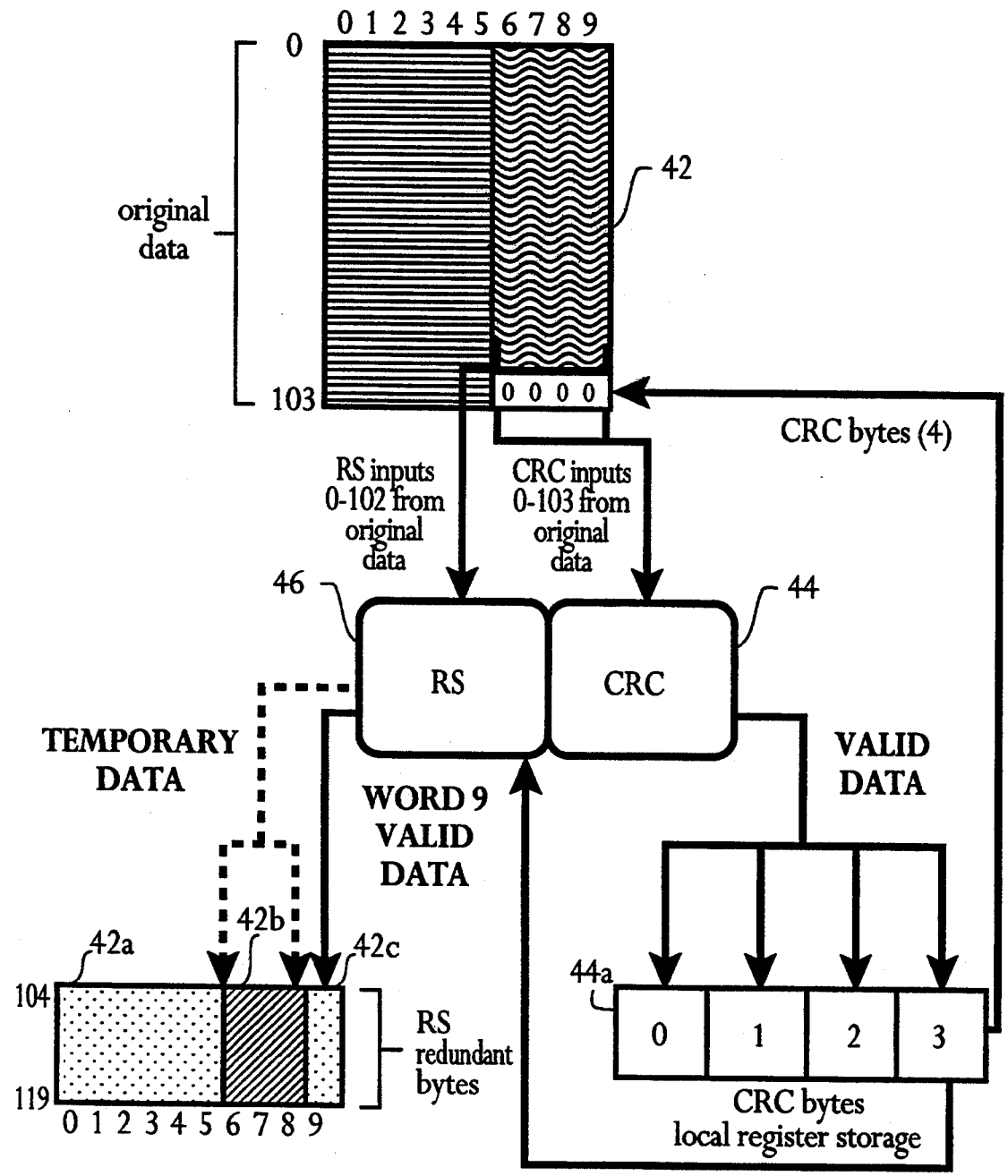
FIG. 7 is a diagram illustrating intermediate steps of the parallel method of encoding in accordance with the second embodiment of the present invention.

Reference is now made to FIG. 7 of the drawings illustrating intermediate steps of the parallel method of encoding, which are directed to encoding words 6-9 of the original data. Words 6-8 are simultaneously supplied from the codeword memory 42 to the CRC encoder 44 and to the RS encoder 46. The counts 0-102 corresponding to each of these words are similar to the counts 0-102 of processing the words 0-5. However, at count 103 of each of the words 6-8, the RS encoder 44 does not process the input data but saves the values stored in the registers 82-112 (FIG. 5). Similarly to the initial steps, at counts 104-107 the CRC encoder 44 saves its CRC values into registers 0-3 of its local storage 44a. At counts 108-123 of each of the words 6-8, the RS bytes generated by the RS encoder 46 are temporarily written into a section 42b of the codeword memory 42. Then, word 9 is simultaneously supplied from the codeword memory 42 to the CRC encoder 44 and to the RS encoder 46. The counts 0-102 of this word are similar to the counts 0-102 of the previous words. At count 103, the RS encoder 46 does not process the input data but saves the values stored in the registers 82-112 (FIG. 5). However, then, instead of taking 16 steps to temporarily write the RS values into the codeword memory 42 (as in words 6-8), the RS encoder 46 waits for the CRC encoder 44 to finish its calculation of the CRC bytes. Accordingly, at counts 104–107 of word 9, the CRC encoder 44 supplies the generated four CRC bytes from its local storage 44a to the codeword memory 42 in order to replace byte 103 of words 6–9. At count 107 of word 9, the last CRC byte stored in the register 3 of the local storage 44a is also sent to the RS encoder 46. At count 108, the RS encoder 46 processes this CRC byte (instead of byte 103 of the original word 9) to complete generation of the RS redundant bytes for word 9. At counts 109–125, the RS encoder 46 writes the generated RS bytes into a section 42c of the codeword memory 42 to form bytes 104–119 of word 9.

Figure 8:
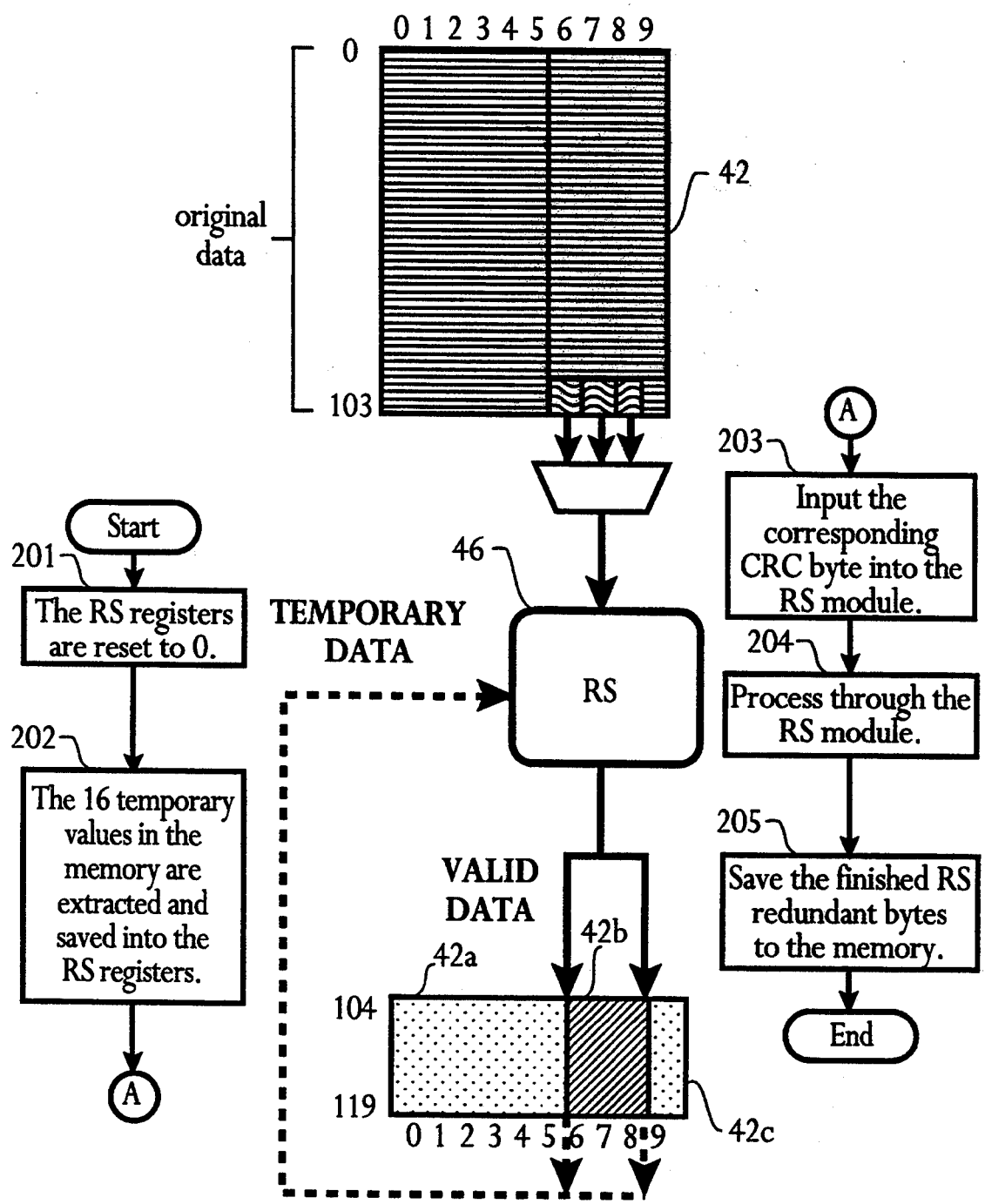
FIG. 8 is a diagram illustrating final steps of the parallel method of encoding in accordance with the second embodiment of the present invention.

Reference is now made to FIG. 8 of the drawings illustrating the final steps of the parallel method of encoding, which complete RS encoding of words 6–8. The final steps for each of the words 6–8 can be divided into five stages 201–205 shown by the flow-chart in FIG. 8, which illustrates interaction between the codeword memory 42 and RS encoder 46. To complete each of the words 6–8, the registers 82–112 (FIG. 5) of the RS encoder 46 are reset to 0 (stage 201). As indicated by dashed line in FIG. 8, the temporary values of 16 RS redundant bytes generated by the RS encoder for a corresponding one of the words 6–8 are shifted in 16 steps from the section 42b of the code word memory 42 to the registers 82–112 (stage 202). At stage 203, the CRC byte formed for a corresponding one of the words 6–8 is read from the codeword memory 42 into the RS encoder 46. It takes one step for the RS encoder 46 to complete the last calculation in order to produce the final RS redundant bytes for corresponding one of the words 6–8 (stage 204). At stage 205, the RS encoder 46 performs 16 steps to output the final RS redundant bytes into the section 42b of the codeword memory 42 to form bytes 104–119 of the corresponding one of the words 6–8. The stages 201–205 are performed sequentially for all of the words 6–8.

Accordingly, the parallel method of encoding in accordance with the second embodiment of the present invention includes:

1) 104×10 steps required for processing 104-byte words 0–9 by RS and CRC encoders simultaneously,
2) 16×10 steps required for extracting 16 RS bytes per word for words 0–9,
3) 4×10 steps required for extracting 4 CRC bytes per word for words 0–9,
4) 1 step required for the RS encoder 46 for processing the CRC byte replacing byte 103 of word 9,
5) 1×3 steps required to reset flip-flops 82–112 of the RS encoder 46 during the stages of finishing words 6, 7 and 8,
6) 16×3 steps required to rewrite 16 temporary RS bytes from the codeword memory 42 into the flip-flops 82–112 during the stages of finishing words 6, 7 and 8,
7) 1×3 steps required to input the CRC byte from the codeword memory 42 into the RS encoder 46 during the stages of finishing words 6, 7 and 8,
8) 1×3 steps required for the RS encoder 46 for processing the CRC byte to complete calculation of the RS bytes during the stages of finishing words 6, 7 and 8, and
9) 16×3 steps required to output the generated 16 RS bytes to codeword memory during the stage of finishing words 6, 7 and 8.

Total number of steps required to perform RS and CRC encoding in accordance with the second embodiment of the invention is equal to 1346. For comparison, as indicated above, the prior art method of encoding requires 2280 steps of the same duration.

Thus, the present invention allows the number of steps required to perform CRC and RS encoding to be drastically reduced. This results in decreasing the total time required for encoding and makes it possible to increase the processing speed of the encoding of original data bytes.

There accordingly has been described two methods for encoding the data to be stored on optical disks, which includes CRC encoding and RS encoding performed simultaneously.

In this disclosure, there are shown and described only the preferred embodiments of the invention, but it is to be understood that the invention is capable of changes and modifications within the scope of the inventive concept as expressed herein.

We claim:

1. A method of encoding a plurality of incoming data elements combined in q words in an error correction system incorporating a Cyclic Redundancy Check (CRC) circuit using h CRC elements, and a Reed-Solomon (RS) encoding circuit, q and h being integers, and h<q, said method comprising the steps of:

RS encoding (q-h) of the q words by the RS encoding circuit to form a plurality of RS redundant elements appended to each of (q-h) incoming words, CRC encoding (q-h) of the q words by the CRC circuit to form the CRC elements to be used for a CRC check, said steps of RS and CRC encoding (q-h) of the q words being performed simultaneously, and thereafter processing the last h of the q words by the CRC circuit and RS encoding circuit to generate h check elements incorporated into the last h words and to form a plurality of RS redundant elements appended to each of the last h words.

2. The method of claim 1, wherein the step of processing comprises the steps of:

CRC encoding the last h words by the CRC circuit to incorporate h CRC elements into the last h words, and thereafter RS encoding the last h words having h check elements by the RS encoder.

3. The method of claim 1, wherein each of the h CRC elements replaces the last incoming element of each of the last h words.

4. The method of claim 1, wherein the step of processing comprises the process of simultaneous CRC and RS encoding the last h words by the CRC circuit and RS encoding circuit.

5. The method of claim 4, wherein the step of simultaneous CRC and RS encoding comprises the steps of:

CRC encoding the incoming elements of the last h words by the CRC circuit to replace h of the incoming elements with the h CRC elements, selectively RS encoding the incoming elements of the last h words by the RS encoding circuit, the step of CRC encoding the last h words being performed simultaneously with the step of selectively RS encoding, and thereafter RS encoding by the RS encoding circuit the CRC elements replacing the h incoming elements of the last h words.

6. The method of claim 5, wherein the step of selectively RS encoding comprises the step of RS encoding by the RS encoding circuit all of the incoming elements of the last h words except the incoming elements to be replaced with the CRC elements.

7. The method of claim 5, wherein the step of RS encoding the check elements comprises the steps of:
processing by the RS encoding circuit the CRC element formed in the q-th word to finish RS encoding the q-th word, and thereafter
processing by the RS encoding circuit the CRC elements formed in the remaining part of the last h words to finish RS encoding the remaining part of the last h words.

8. A method of encoding a plurality of incoming data elements combined in q words in an encoding system incorporating a Cyclic Redundancy Check (CRC) circuit using h CRC elements and a Reed-Solomon (RS) encoding circuit, wherein h is an integer said method comprising the steps of:
CRC encoding the q words by the CRC circuit to form h CRC elements to be used for the CRC check, wherein q is an integer of value greater than h,
selectively RS encoding q words by the RS encoding circuit to form a plurality of RS redundant elements, and
said steps of selectively CRC encoding and RS encoding the q words being performed simultaneously.

9. The method of claim 8, wherein said encoding system further includes an RS storage for temporarily storing the RS redundant elements, said step of selectively RS encoding comprising the steps of:
RS encoding (q-h) of the q words by the RS encoder to form a plurality of RS redundant elements appended to the (q-h) of the q words, and thereafter
RS encoding all of (q-h) words, excluding the last q word, by the RS encoding circuit to form a plurality of temporary RS elements temporarily stored in said RS storage, and
RS processing the last one of the q words by the RS encoder.

10. The method of claim 9, after said step of the CRC encoding further comprising the steps of:
forming by the RS encoding circuit the last RS redundant elements appended to the last one of the q words using at least one of the CRC elements, and thereafter
forming by the RS encoding circuit valid RS redundant elements appended to the remaining part of the h words.

11. The method of claim 10, wherein said step of forming valid RS redundant elements comprises the steps of:
supplying the temporary RS elements from the RS storage to the RS encoding circuit to RS encode the CRC elements for generating the valid RS redundant elements corresponding to the remaining part of the last h words, and
appending the valid RS redundant elements to the remaining part of the last h words.

12. The method of claim 11, wherein said plurality of valid redundant elements are formed for each one of the remainder of the last h words.

13. A method of encoding a plurality of incoming data elements combined in q words in an error correction system including a Cyclic Redundancy Check (CRC) circuit using h CRC elements, and a Reed-Solomon (RS) encoding circuit, q and h being integers and h<q, a main memory containing the original data bytes and an additional memory appended to the main memory and having first, second and third storage areas, said method comprising the steps of:
storing the plurality of incoming elements in said main memory,
simultaneously supplying (q-h) of the q words from the main memory to the CRC circuit and RS encoding circuit for forming h CRC check bytes and RS elements for the (q-h) words,
writing the RS elements for the (q-h) words into the main memory,
supplying the next (h-1) of the q words from the main memory to the RS encoding circuit and CRC circuit for simultaneously forming temporary RS elements and the CRC elements for the (q-1) words,
writing the temporary RS elements into the second storage area of the additional memory,
supplying the last one of the q words from the main memory to the CRC circuit and RS encoding circuit for processing,
forming by the CRC circuit the CRC elements after the last word,
supplying (h-1) CRC bytes to the main memory,
simultaneously supplying the formed CRC element for the last word to the RS encoding circuit to finish processing the last word and to the main memory,
forming RS elements for the last word by the RS encoder,
writing the formed RS elements for the last word into the third storage area of the additional memory,
supplying the temporary RS elements from the second storage area and the CRC elements for the (h-1) words from the main memory to the RS encoding circuit to finish RS encoding the (h-1) words and form the RS elements for the (h-1) words, and
writing the formed RS elements for the (h-1) words into the second storage area of the additional memory.

14. A system for encoding a plurality of incoming data elements combined in q words, q being an integer,
a CRC encoding circuit for encoding (q-h) of the q words to be used to form the CRC elements for a CRC check, wherein h is an integer less than q; and
an RS encoding circuit for encoding (q-h) of the q words to form a plurality of RS redundant elements, appended to each of (q-h) incoming words;
means for controlling said RS and CRC encoding circuits to encode (q-h) of the q words simultaneously and thereafter CRC and RS encoding the last h of the q words to form the plurality of RS redundant elements appended to each of the last h words and to generate h check elements incorporated into the last h words.

* * * * *